United States Patent [19]

Westlund

[11] Patent Number: 4,474,258

[45] Date of Patent: Oct. 2, 1984

[54] LOUDSPEAKER ENCLOSURE AND WAVEFORM ENERGY REFLECTOR

[76] Inventor: James R. Westlund, Blue Hills Rte. #2, Dewey, Ariz. 86327

[21] Appl. No.: 338,553

[22] Filed: Jan. 11, 1982

[51] Int. Cl.[3] .............................................. H05K 5/00

[52] U.S. Cl. .................................... 181/151; 181/153; 181/155; 181/199; 181/DIG. 1

[58] Field of Search ............................... 181/151-156, 181/191, 199, 175, DIG. 1

[56] References Cited

U.S. PATENT DOCUMENTS

| | | | |
|---|---|---|---|
| 1,628,010 | 5/1927 | Taylor | 181/195 X |
| 1,823,705 | 5/1931 | Smith | 181/160 |
| 1,855,837 | 4/1932 | King et al. | 181/157 X |
| 3,642,091 | 2/1972 | Nohara et al. | 181/152 X |
| 3,819,005 | 6/1974 | Westlund | 181/155 X |
| 3,819,006 | 6/1974 | Westlund | 181/155 X |
| 3,912,866 | 10/1975 | Fox | 181/155 X |
| 4,281,738 | 8/1981 | Jackson | 181/153 X |
| 4,356,880 | 11/1982 | Downs | 181/30 |

*Primary Examiner*—Benjamin R. Fuller

*Attorney, Agent, or Firm*—Willis E. Higgins

[57] ABSTRACT

An enclosure for a loudspeaker has a housing formed of sound reflecting material having opening dimensioned for mounting of a loudspeaker therein. A body of sound deadening material is disposed within the housing. The body of sound deadening material defines a bell-shaped chamber having a top and a bottom. The top of the bell-shaped chamber is located at the loudspeaker opening and the bottom of the bell-shaped enclosure is remote from the loudspeaker opening. The enclosure is preferably used in combination with a novel sinusoidal waveform energy reflector. The reflector has first and second surfaces each having an exponential cross-section and being reflective to the waveform energy. The first surface terminates in an apex pointing at a source of the waveform energy, such as a loudspeaker. The second surface intersects the first surface around a perimeter of the first surface. The loudspeaker enclosure produces sinusoidal sound waves more accurately and with less speaker fatigue, and the exponential reflector reflects those sound waves more accurately than in the prior art.

14 Claims, 5 Drawing Figures

LOUDSPEAKER ENCLOSURE AND WAVEFORM ENERGY REFLECTOR

BACKGROUND OF THE INVENTION

This invention relates to a novel enclosure for a loudspeaker which results in improved loudspeaker performance. It also relates to an improved waveform energy reflector which may be utilized in combination with the loudspeaker enclosure, which combination both gives improved loudspeaker performance and disperses sound more accurately. In particular, the present invention increases sustain characteristics of sound or other waveform energy produced with its use. It further produces a shear wave to disperse sounds or other energy produced with less distortion of the sounds.

As used herein, the term "sustain" refers to non-interferring, usable energy wave impulses that enhance and effectively prolong the initial frequency pressures developed by a selected or specific waveform transducer, such as a speaker cone, without distorting previous or subsequent frequency responses. The term "shear wave" refers to a wave in an elastic medium which causes an element of the medium to change its shape without changing its volume. As applied to a loudspeaker, the enclosure and speaker of this invention produces a shear wave as its primary waveform by reflecting and dispersing sound waves produced by the speaker. Air is the elastic medium and the enclosure and reflector are the shape changing means. Due to the shape of the enclosure and reflector of this invention, the shear wave is produced without substantial distortion of the sound. The term "sinusoidal" refers both to a waveform that can be described by a simple sine function and to the combination of simple sine function waveforms with more complex waveform patterns to give a complex sinusoidal waveform.

In my prior U.S. Pat. Nos. 3,819,005 and 3,819,006, issued June 25, 1974, structures are described in which enclosures forming a spherical chamber behind a loudspeaker and a reflector positioned in front of the loudspeaker are provided. The structures described in those patents have now achieved a degree of acceptance as a result of their ability to provide improved sound quality at large outdoor public gatherings, including outdoor performances of symphony orchestras and large choral groups. While the present invention also provides a chamber behind the speaker and a reflector in front of the speaker, it has now been determined that further improvements in sound quality may be achieved by constructing the chamber and reflector in a different manner.

SUMMARY OF THE INVENTION

Accordingly, it is an object of this invention to provide a loudspeaker enclosure that provides optimum loading for the speaker.

It is another object of the invention to provide a loudspeaker enclosure that increases speaker life over prior art enclosures.

It is a further object of the invention to provide a loudspeaker enclosure which increases effective output from the loudspeaker from a given amount of energy over prior art enclosures.

It is still another object of the invention to provide a loudspeaker enclosure which reduces ear fatigue for a listener over prior art enclosures.

It is a still further object of the invention to provide a loudspeaker enclosure that increases sustain characteristics over prior art enclosures for sounds produced by the loudspeaker.

It is yet another object of the invention to provide a loudspeaker enclosure that reduces cone aberration and shimmy and sway of speaker components over prior art enclosures.

It is another object of the invention to provide a loudspeaker enclosure which will deliver a particular tone or frequency in a sustain mode while accepting and accurately reproducing other frequencies applied to the enclosure.

It is a further object of the invention to provide a loudspeaker enclosure in which third harmonic frequency phase shift is substantially eliminated.

It is still another object of the invention to provide a reflector for sinusoidal waveform energy which reflects the energy and preserves its sinusoidal character more accurately than prior art reflectors.

It is yet another object of the invention to provide a sound reflector for sinusoidal waveform energy of increased rigidity in its shape.

It is a special object of the invention to provide a loudspeaker enclosure and reflector combination which achieves the above objects and disperses sound more accurately than prior art enclosure and reflector combinations.

It is another special object of the invention to provide such an enclosure and reflector combination which disperses sound over a wide angle uniformly by creating a shear wave without substantial distortion of the sound.

The above and related objects may be achieved through use of the novel loudspeaker enclosure, sinusoidal waveform energy reflector, and loudspeaker, enclosure and reflector combination herein disclosed. A loudspeaker enclosure in accordance with this invention has a housing formed of a sound reflecting material having an opening dimensioned for mounting a loudspeaker in the opening. In one form of the invention, a body of sound deadening material, such as foamed polymeric material, is contained within the housing. The body of sound deadening material defines a bell-shaped chamber having a top and a bottom. A top of the bell-shaped chamber is located at the loudspeaker opening, and the bottom of the bell-shaped enclosure is remote from the loudspeaker opening. As used herein, the term "bell-shaped" refers to a shape corresponding to that generated by rotating a reverse curve about an axis parallel to the longitudinal direction of the curve through an arc of 360°.

The loudspeaker enclosure of this invention in combination with a loudspeaker is preferably employed in combination with the novel reflector for substantially sinusoidal oscillatory waveform energy herein disclosed. The reflector comprises first and second surfaces each having an exponential cross-section and being reflective to the waveform energy. The first surface terminates in an apex for pointing at a source of the waveform energy. The second surface intersects the first surface around a perimeter of the first surface. For use in combination with a single loudspeaker, the reflector desirably has a shape corresponding to that generated by rotating the exponential cross-sections through 360°. A similar, but oval, shape may be employed as a single reflector in combination with more than one loudspeaker.

A bell-shaped chamber within a loudspeaker enclosure and behind the loudspeaker in accordance with this invention gives a substantial improvement in loudspeaker loading over that obtained with prior art loudspeaker enclosure designs. This results in an increase in speaker output with a given amount of energy supplied to the loudspeaker, because the bell-shaped chamber resonates better with the loudspeaker than with the chamber of prior art loudspeaker enclosures. In addition to reducing speaker cone aberration and shimmy and sway of such speaker components as the spider and annulus of the loudspeaker, such improved loading of the speaker reduces ear fatigue by helping to preserve the sinusoidal character of sound waves generated by the speaker. Further assistance in maintaining the acoustical output of the speaker as close as possible to a sine wave pattern is obtained from the novel shape of the reflector for sinusoidal waveform energy of this invention in combination with an exterior shape to the loudspeaker enclosure with low diffractive architectural characteristics. The bell-shaped chamber of this invention will produce a particular tone or frequency in a sustain mode, while accurately reproducing other frequencies applied to the enclosure. The result is less decay of instrumental tonal source without interference with previous or subsequent frequencies, thus adding a new embellishment to musical quality.

The attainment of the foregoing and related objects, advantages and features of the invention should be more readily apparent to those skilled in the art, after a review of the following more detailed description of the invention, taken together with the drawings, in which:

DETAILED DESCRIPTION OF THE INVENTION

Figure 1:
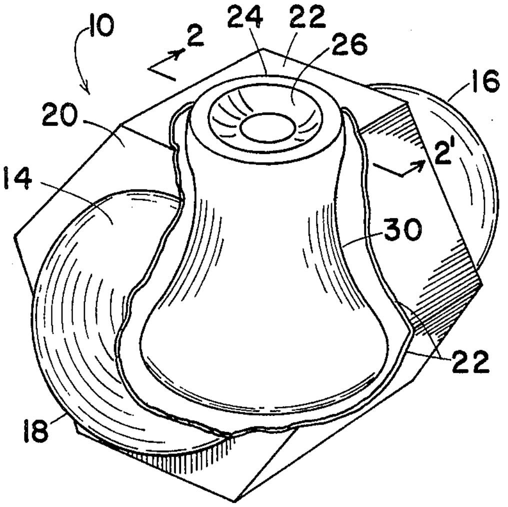
FIG. 1 is an external perspective view of a loudspeaker enclosure in accordance with the invention, with a partial cutaway to show interior detail.
Figure 2:
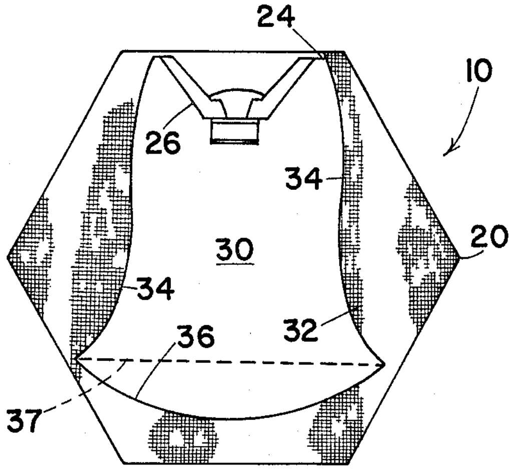
FIG. 2 is a cross-section of the loudspeaker enclosure shown in FIG. 1, taken along the line 2—2' in FIG. 1.
Figure 3:
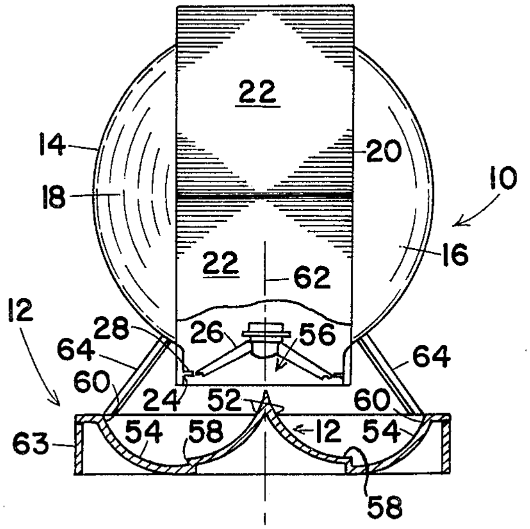
FIG. 3 is a side view of the loudspeaker enclosure of FIG. 3, but in a different orientation and with a cross-section of a reflector in accordance with the invention in place in combination with the loudspeaker enclosure.

Turning now to the drawings, more particularly to FIGS. 1-4, there is shown a loudspeaker enclosure 10 and a sound wave reflector 12 in accordance with the invention. The enclosure 10 has a housing 14, which is fabricated of fiberglass or other relatively hard, sound reflecting material. The housing 14 has a generally spheroidal shape. In particular, the housing 14 is formed from two sphere portions 16 and 18, joined by a hexagonal equatorial band 20. The hexagonal band 20 has a plurality of faces 22, one of which has an opening 24 dimensioned and configured to receive loudspeaker 26. As is best shown in FIG. 3, opening 24 desirably has a flange 28 for mounting of the loudspeaker 26 in a conventional manner. Behind loudspeaker 26 is a bell-shaped chamber 30, which is formed within a body 32 of foamed polyurethane or other plastic, or other suitable sound deadening material. As is best shown in FIGS. 1 and 2, the bell-shaped chamber 30 has a shape corresponding to that obtained by rotating a reverse curved line 34 through 360° about a longitudinal axis of the chamber 30.

As is best shown in FIG. 2, the bell-shaped chamber 30 has a concave bottom 36 with respect to the speaker 26. The concave bottom 36 may, for example, be either a concave arc of a circle or of a hyperbola.

It should be recognized that the bottom of the chamber 30 may vary between the concave shape shown and a convex shape, for example, a convex exponential curve, to provide the proper volume for the particular speaker 26 employed in the enclosure 10. The volume may be calculated by equations known to those skilled in the art of speaker and enclosure design, for providing a proper volume of air in the chamber for the speaker used. Thus, the bottom 36 of the chamber may extend above or below line 37, which defines a traditional bell shape. As used herein, the term "bell-shaped chamber" encompasses such variations in shape of the chamber 30. In addition to polymer foam, any other material with proper speaker loading properties and formulated to reduce resonance with the housing 14 of the enclosure 10 may be used.

Figure 4:
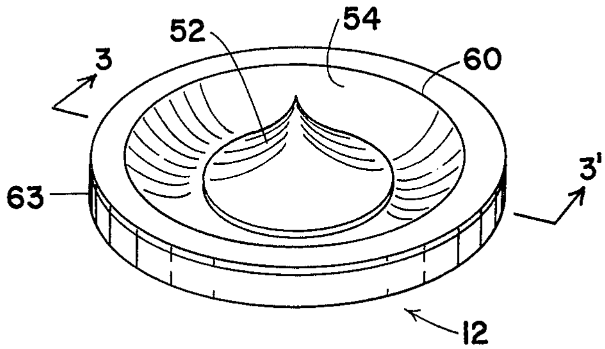
FIG. 4 is a perspective view of the reflector shown in cross-section in FIG. 3.

While a substantial improvement in performance of loudspeaker 26 may be achieved through use of enclosure 10 alone, it is preferred to use the enclosure in combination with the reflector 12, as shown in FIGS. 3 and 4. While a reflector having the configuration shown in my earlier U.S. Pat. No. 3,819,005 may be employed with the enclosure 10, the sinusoidal character of sound waves from the loudspeaker 26 is reflected more accurately if the reflector 12 is formed from two exponentially curved surfaces 52 and 54. Reflector 12 is fabricated of fiberglass, suitably synthetic resinous plastic, wood, metal, or any other suitable sound reflecting material, singly or in combination.

As is shown best in FIG. 3, the exponentially curved surface 52 has a predetermined radius of curvature at apex 56. This radius of curvature increases in an exponential manner moving along the surface 52 toward its perimeter 58. Similarly, the second exponentially curved surface 54 has a predetermined radius of curvature at its perimeter 60, which radius of curvature increases in an exponential manner moving along the surface 54 toward perimeter 58 of the first exponentially curved surface 52. Perimeter 58 corresponds in size to the diameter of speaker 26. As can best be seen in FIG. 4, the reflector 12 has a shape corresponding to that obtained by rotating first and second exponential curves corresponding to the cross-sections of surfaces 52 and 54 as shown in FIG. 2 through 360° about a centrally disposed axis 62 through the reflector 12. For use with sound waves, as in FIGS. 3 and 4, one set of exponential surfaces 52 and 54 will be chosen, depending on speaker characteristics. For light or other sinusoidal waveform energy, other sets of exponential surfaces for the reflector would be chosen.

Side 63 of the reflector 12 forms a flange extending from perimeter 60 of the second exponentially curved surface 54. This construction substantially increases the shape rigidity of the reflector 12. The increased rigidity prevents oscillation at the apex 56 of the first exponentially curved surface 52, further contributing to accurate sound reflection.

Enclosure 10 and reflector 12 are joined by means of struts 64 or other suitable supports, fastened around periphery 60 of the reflector 12 at one end and to the housing 14 of enclosure 10 at the other end. If desired, the struts 64 may have the configuration of the fastening assemblies disclosed in my earlier U.S. Pat. No. 3,819,005.

In operation, loudspeaker 26 produces sound waves having sinusoidal oscillations, which are reflected by the surfaces 52 and 54 of reflector 12 against the exterior of housing 14 of enclosure 10. Housing 14 then acts to disperse the reflected sound waves into the air surrounding enclosure 10. Housing 14 preferably should have a configuration suitable for substantially uniform sound dispersion in the directions for which sound transmission is desired, and it should have low diffractive architectural characteristics. The shape shown in FIGS. 1 and 3 for the housing has these characteristics. Both the bell shape of chamber 30 and the shapes of surfaces 52 and 54 of reflector 12 result in more accurate sinusoidal generation and reflection of the sound waves. Thus, a shear wave is used to disperse the sounds without producing substantial distortion of them.

Figure 5:
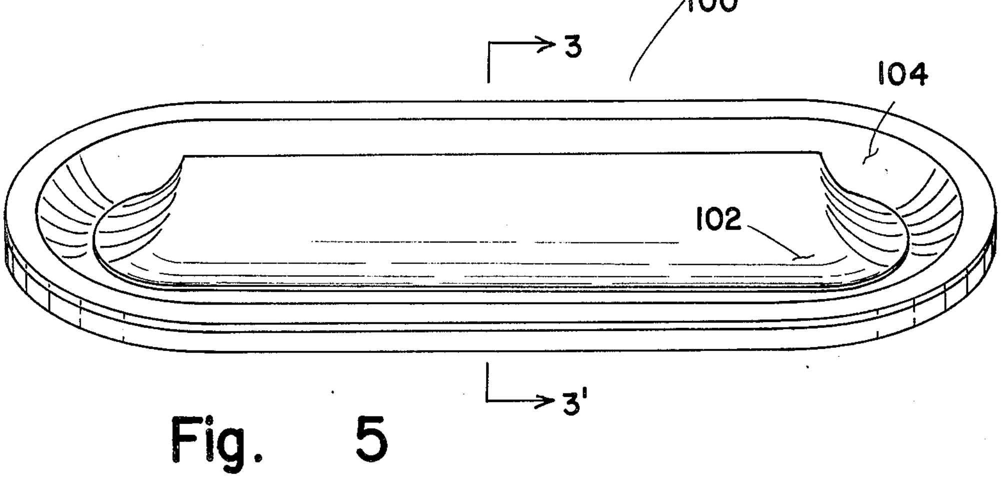
FIG. 5 a perspective view of another embodiment of a reflector in accordance with the invention.

FIG. 5 shows another embodiment of a reflector 100 in accordance with the invention. The reflector 100 has first and second surfaces 102 and 104 having cross-sections respectively corresponding to those of surfaces 52 and 54 in FIGS. 3 and 4. The reflector 100 has an elongated, oval configuration as shown, in order that it may be positioned facing a plurality of loudspeakers in separate enclosures, in the manner disclosed in my earlier U.S. Pat. No. 3,819,006. In other respects, the configuration and use of the FIG. 5 reflector 100 is the same as the configuration and use of the FIGS. 3 and 4 reflector 12.

It should now be apparent to those skilled in the art that a novel loudspeaker enclosure and reflector for sinusoidal waveform energy capable of achieving the stated objects of the invention has been provided. The bell shape of the loading chamber behind a loudspeaker mounted in the enclosure of this invention provides better loading for the loudspeaker, increasing speaker life by increasing speaker output from a given amount of energy, and reducing cone aberration and shimmy and sway of other speaker components such as its spider and annulus. The novel sinusoidal waveform energy reflector of this invention also preserves the sinusoidal character of the waveform energy reflected. In combination, the novel enclosure and novel reflector of this invention reduce ear fatigue for a listener by allowing the acoustical output of the speaker to remain closer to a sine wave pattern than possible with prior art loudspeaker enclosures, whether or not used in combination with a reflector. While this reduction in ear fatigue is of value in speaker systems intended for public gatherings, it may also have special value in miniaturized versions of the invention, such as for incorporation in headphones or hearing aids. The enclosure design eliminates third harmonic frequency phase shift in sounds produced using it, which further reduces distortion of the sound reproduction.

It should further be apparent to those skilled in the art that various changes in form and details of the invention as shown and described may be made. For example, the reflector may be used for other sinusoidal waveform energy than sound waves. If the reflector is fabricated of stainless steel or has a smooth chromium surface, it may be used for reflection of light. The speaker and reflector may also be positioned in other orientations than shown in FIGS. 1–3. For example speakers used with the FIG. 4 reflector embodiment and the reflector 100 are typically oriented vertically, with the speakers facing the reflector 100 in a manner similar to that shown in FIG. 3.

What is claimed is:

1. In combination, a loudspeaker, an enclosure having an opening into which said loudspeaker is mounted, and a hollow bell shaped chamber within said enclosure and behind said loudspeaker, said bell-shaped chamber having a top at the opening, and a closed bottom remote from said loudspeaker, said bell-shaped chamber being defined by a body of sound deadening material within said enclosure, and said hollow bell-shaped chamber being free of obstruction behind said speaker.

2. The combination of claim 1 in which the bottom of said bell-shaped chamber is concave relative to said speaker.

3. The combination of claim 1 in which the bottom of said bell-shaped chamber is convex relative to said speaker.

4. The combination of claim 1 in which said bell-shaped chamber is defined by a foamed plastic material.

5. The combination of claim 4 in which said enclosure is a spheroid.

6. The combination of claim 5 in which the spheroid has an equatorial polygonal band and the speaker is mounted in a surface of the polygonal band.

7. The combination of claim 1 additionally comprising:

means facing said speaker for reflecting sound waves from said loudspeaker to an exterior surface of said enclosure.

8. The combination of claim 7 in which said reflecting means has first and second surfaces each having an exponential cross-section, said first surface terminating in an apex pointed toward said loudspeaker, and said second surface intersecting said first surface around a perimeter of said first surface.

9. The combination of claim 8 in which said first and second surfaces correspond to that generated by rotating their exponential cross-sections through 360°.

10. An enclosure for a loudspeaker, comprising a housing formed of a sound reflecting material having an opening dimensioned for mounting of a loudspeaker therein, and a body of sound deadening material within said housing, said body of sound deadening material defining a hollow bell-shaped chamber having a top and a closed bottom, the top of the bell-shaped chamber being located at the loudspeaker opening and the bottom of the bell-shaped enclosure being remote from the loudspeaker opening, said hollow bell-shaped chamber being free of obstruction behind the loudspeaker opening.

11. The enclosure of claim 10 in which the bottom of the bell-shaped enclosure is concave relative to the loudspeaker opening.

12. The enclosure of claim 10 in which the bottom of the bell-shaped enclosure is convex relative to the loudspeaker opening.

13. The enclosure of claim 10 in which said housing is a spheroid.

14. The enclosure of claim 13 in which the spheroid has an equatorial polygonal band and the loudspeaker opening is located in a surface of the polygonal band.

* * * * *